US009179238B2

(12) United States Patent
Ho

(10) Patent No.: US 9,179,238 B2
(45) Date of Patent: Nov. 3, 2015

(54) APPLICATION SOFTWARE AND METHOD FOR AUTOMATICALLY ADJUSTING ENVIRONMENTAL FREQUENCY RESPONSE

(71) Applicant: Homni Enterprise Co., Ltd., Taipei (TW)

(72) Inventor: Chin-Chen Ho, Tainan (TW)

(73) Assignee: Homni Enterprises Co., Ltd., Taipei (TW)

( * ) Notice: Subject to any disclaimer, the term of this patent is extended or adjusted under 35 U.S.C. 154(b) by 150 days.

(21) Appl. No.: 14/140,015

(22) Filed: Dec. 24, 2013

(65) Prior Publication Data

US 2015/0181362 A1 Jun. 25, 2015

(51) Int. Cl.
*H03G 5/00* (2006.01)
*H04S 7/00* (2006.01)

(52) U.S. Cl.
CPC ..................................... *H04S 7/307* (2013.01)

(58) Field of Classification Search
None
See application file for complete search history.

(56) References Cited

U.S. PATENT DOCUMENTS

2013/0066453 A1* 3/2013 Seefeldt .......................... 700/94
2014/0169605 A1* 6/2014 Tinaphong et al. ........... 381/334

* cited by examiner

*Primary Examiner* — Regina N Holder
(74) *Attorney, Agent, or Firm* — Alan D. Kamrath; Kamrath IP Lawfirm, PA

(57) ABSTRACT

An application software for automatically adjusting environmental frequency response is installed in a communication device and provided for outputting a sine wave audio frequency to a stereo. The stereo receives and plays the sine wave audio frequency. A built-in microphone of the communication device receives the audio frequency outputted from the stereo. After obtaining an appropriate reference gain of 1 KHz, the application software outputs a sine wave audio frequency of 20 Hz~20 KHz to the stereo and compares the gain value of the audio frequency outputted from the stereo with the reference gain value. The micro-controller of the stereo adjusts the gain of the current audio frequency to comply with the reference gain value, so that the stereo can have an output approaching/reaching an ideal frequency response curve.

3 Claims, 2 Drawing Sheets

APPLICATION SOFTWARE AND METHOD FOR AUTOMATICALLY ADJUSTING ENVIRONMENTAL FREQUENCY RESPONSE

BACKGROUND OF THE INVENTION

1. Field of the Invention

The present invention relates to application software for automatically adjusting an environmental frequency response and, more particularly, to the application software installable in a communication device. The communication device has a Bluetooth/WiFi module that can be connected to a stereo. The communication device receives an audio frequency of the stereo, and the application software compares an outputted audio frequency of the stereo and further controls a micro-controller of the stereo. Thus, the micro-controller can adjust the sound volume of the stereo to a default value and store the sound volume to achieve the effect of having an output of the stereo approaching or reaching the ideal frequency response curve.

2. Description of the Related Art

Some of the high-end stereos available in the market come with an equalizer integrated circuit (EQIC), and the equalizer integrated circuit has an adjusting function for automatically adjusting a frequency response according to a different environment of the stereo to achieve the ideal frequency response curve and output sound approaching the original sound effect. In general, a person can distinguish an audio frequency of 20 Hz~20 KHz, and a conventional automatic frequency response adjusting function usually makes a compensation or adjustment to a corresponding frequency response by putting a microphone at a position for listening to music and obtaining the audio frequency signal of 20 Hz~20 KHz outputted from the stereo.

However, the microphone used for the conventional way of adjusting the equalizer integrated circuit is not standard required equipment of the stereo. In addition, the integrated circuit with an automatic frequency response adjusting function has a relatively higher price.

SUMMARY OF THE INVENTION

Therefore, it is a primary objective of the present invention to provide an application software that can be installed in a communication device. The communication device of Bluetooth/WiFi can communicate with a stereo of Bluetooth/WiFi. The communication device receives an audio frequency of the stereo, and the application software compares the outputted audio frequency of the stereo and further automatically controls a micro-controller of the stereo. The micro-controller adjusts the sound volume of the stereo to a default value and saves the sound volume, so that the outputted audio frequency of the stereo approaches/reaches an ideal frequency response curve.

To achieve the aforementioned objective, the present invention provides an application software that can be installed in a communication device. The communication device can be connected to a stereo, and the application software is used together with the stereo. The application software is comprised of a control unit, an output unit and a computing unit. The control unit is a micro-controller for controlling the stereo and for further controlling an equalizer integrated circuit. The output unit is provided for outputting a sine wave signal to the stereo. The computing unit is provided for computing a gain value of the audio frequency captured by the built-in microphone of the communication device. After a user puts the communication device at a position for listening to music and connects the communication device with the stereo, the communication device receives an audio frequency generated by the stereo. The application software compares the outputted audio frequency of the stereo and further automatically controls a micro-controller of the stereo, so that the micro-controller can adjust a sound volume of the stereo to a default value and saves the sound volume, and so that the outputted audio frequency of the stereo approaches/reaches an ideal frequency response curve (with a frequency falling within a range of 20 Hz~20 KHz).

DETAILED DESCRIPTION OF THE PREFERRED EMBODIMENTS

The technical characteristics, contents, advantages and effects of the present invention will be apparent with the detailed description of preferred embodiments accompanied with related drawings as follows.

Figure 1:
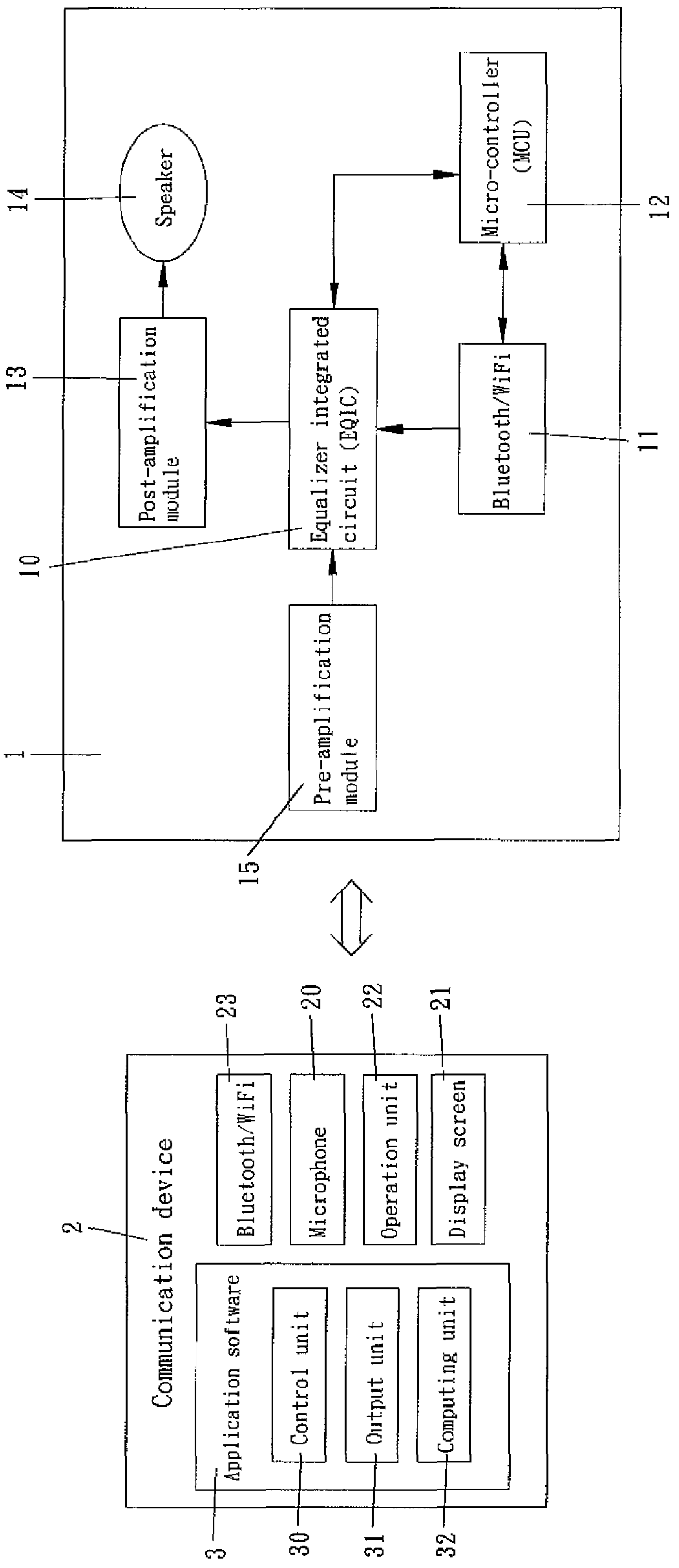
FIG. 1 is a structural block diagram of a preferred embodiment of the present invention.

In FIG. 1, the application software of the present invention is used together with a stereo 1. The application software 3 such as an Application Program (APP) is installed to a communication device 2 (such as a Smartphone or a tablet PC). The stereo 1 comprises an equalizer integrated circuit 10 for adjusting an outputted audio frequency of the stereo 1. A Bluetooth/WiFi module 11 is coupled to the equalizer integrated circuit 10, for receiving/transmitting a signal. A micro-controller 12 is coupled to the Bluetooth/WiFi module 11, for controlling the equalizer integrated circuit 10. A post-amplification module 13 is coupled to the equalizer integrated circuit 10, for amplifying the intensity of an audio frequency signal. A speaker 14 is coupled to the post-amplification module 13, for generating an audio frequency. A pre-amplification module 15 is coupled to the equalizer integrated circuit 10, for processing an audio signal.

The communication device 2 has a microphone 20, a display screen 21 installed on a surface of the communication device 2, an operation unit 22 and a Bluetooth/WiFi module 23 installed in the communication device 2. The operation unit 22 is coupled to the microphone 20, the display screen 21 and the Bluetooth/WiFi module 23. The application software 3 comprises a control unit 30 for controlling a micro-controller 12 of the stereo 1 to further control the equalizer integrated circuit 10. An output unit 31 outputs a sine wave signal to the stereo 1. A computing unit 32 computes a gain value of the audio frequency captured by the microphone 20.

Figure 2:
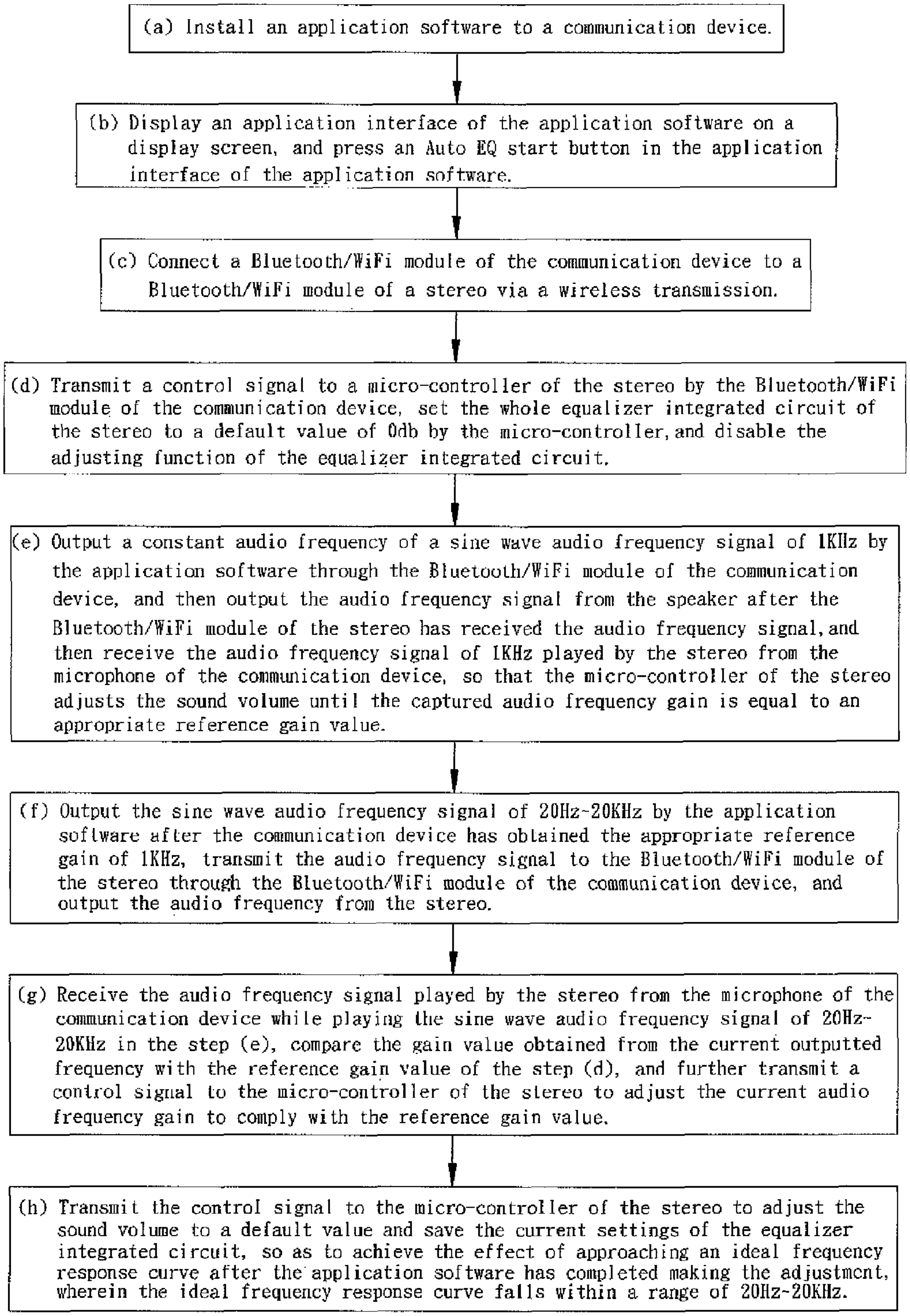
FIG. 2 is a flow chart of a preferred embodiment of the present invention.

With reference to FIGS. 1 and 2, the method of the present invention comprises the following steps:

(a) Install an application software 3 to a communication device 2;

(b) Display an application interface of the application software 3 on a display screen 21, and press an Auto EQ start button in the application interface of the application software 3;

(c) Connect a Bluetooth/WiFi module 23 of the communication device 2 to a Bluetooth/WiFi module 11 of a stereo 1 via a wireless transmission;

(d) Transmit a control signal to a micro-controller 12 of the stereo 1 by the Bluetooth/WiFi module 23 of the communication device 2, set the whole equalizer integrated circuit 10 of the stereo 1 to a default value of 0 db by the micro-controller 12, and disable the adjusting function of the equalizer integrated circuit 10;

(e) Output a constant audio frequency of a sine wave audio frequency signal of 1 KHz by the application software 3 through the Bluetooth/WiFi module 23 of the communication device 2, output the sine wave audio frequency signal from the speaker 14 after the Bluetooth/WiFi module 11 of the stereo 1 has received the sine wave audio frequency signal, and then receive the sine wave audio frequency signal of 1 KHz played by the stereo 1 from the microphone 20 of the communication device 2, so that the micro-controller 12 of the stereo 1 adjusts the sound volume until the captured audio frequency gain is equal to an appropriate reference gain value;

(f) Output the sine wave audio frequency signal of 20 Hz~20 KHz by the application software 3 after the communication device 2 has obtained the appropriate reference gain of 1 KHz, transmit the audio frequency signal to the Bluetooth/WiFi module 11 of the stereo 1 through the Bluetooth/WiFi module 11 of the communication device 2, and output the audio frequency from the stereo 1;

(g) Receive the audio frequency signal played by the stereo 1 from the microphone 20 of the communication device 2 while playing the sine wave audio frequency signal of 20 Hz~20 KHz in the step (e), compare the gain value obtained from the current outputted frequency with the reference gain value of the step (d), and further transmit a control signal to the micro-controller 12 of the stereo 1 to adjust the current audio frequency gain to comply with the reference gain value; and (h) Transmit the control signal to the micro-controller 12 of the stereo 1 to adjust the sound volume to a default value and save the current settings of the equalizer integrated circuit 10, to achieve the effect of approaching an ideal frequency response curve after the application software 3 has completed making the adjustment, with the ideal frequency response curve falling within a range of 20 Hz~20 KHz.

The application software 3 outputs sine wave frequencies of 20 Hz~20 KHz from low to high, and the Bluetooth/WiFi module 23 of the communication device 2 transmits the signal to the Bluetooth/WiFi module 11 of the stereo 1. Then the speaker 14 outputs the signal, and the microphone 20 of the communication device 2 captures the signal to compare the difference of the gains, and automatically adjusts the equalizer integrated circuit 10 according to the difference, to achieve the effect of approaching/reaching an ideal frequency response curve.

In summation of the description above, the present invention achieves the expected functions and objectives. While the invention has been described by means of specific embodiments, numerous modifications and variations could be made thereto by those skilled in the art without departing from the scope and spirit of the invention set forth in the claims.

What is claimed is:

1. A method for automatically adjusting an environmental frequency response, comprising:

(a) installing an application software to a communication device;

(b) displaying an application interface of the application software on a display screen of the communication device, and pressing an Auto EQ start button in the application interface of the application software;

(c) connecting a Bluetooth/WiFi module of the communication device to a built-in Bluetooth/WiFi module of a stereo via a wireless transmission;

(d) transmitting a control signal from the Bluetooth/WiFi module of the communication device to a micro-controller of the stereo, and set a whole equalizer integrated circuit of the stereo to a default value of 0 db by the micro-controller, and disabling an adjusting function of the whole equalizer integrated circuit;

(e) outputting a constant audio frequency of a sine wave audio frequency signal of 1 KHz by the application software through the Bluetooth/WiFi module of the communication device, outputting the sine wave audio frequency signal from a speaker after the Bluetooth/WiFi module of the stereo has received the sine wave audio frequency signal, and then receiving the sine wave audio frequency signal of 1 KHz played by the stereo from a built-in microphone of the communication device, wherein the micro-controller of the stereo adjusts sound volume until a captured audio frequency gain is equal to an appropriate reference gain value;

(f) outputting the sine wave audio frequency signal of 20 Hz~20 KHz by the application software after the communication device has obtained the appropriate reference gain value of 1 KHz, transmitting the sine wave audio frequency signal to the Bluetooth/WiFi module of the stereo through the Bluetooth/WiFi module of the communication device, and outputting the constant audio frequency from the stereo;

(g) receiving the sine wave audio frequency signal played by the stereo from the microphone of the communication device while playing the sine wave audio frequency signal of 20 Hz~20 KHz, comparing a gain value obtained from a current outputted frequency with the appropriate reference gain value, and further transmitting a control signal to the micro-controller of the stereo to adjust a current audio frequency gain to comply with the appropriate reference gain value; and (h) transmitting the control signal to the micro-controller of the stereo to adjust the sound volume to a default value and save current settings of the whole equalizer integrated circuit, to achieve approaching an ideal frequency response curve after the application software has completed making adjustment.

2. The method for automatically adjusting environmental frequency response according to claim 1, wherein the communication device is a Smartphone/table PC.

3. The method for automatically adjusting environmental frequency response according to claim 1, wherein the ideal frequency response curve has an audio frequency of 20 Hz~20 KHz.

* * * * *